United States Patent
Tang et al.

(10) Patent No.: US 11,222,756 B2
(45) Date of Patent: Jan. 11, 2022

(54) GRAPHENE-SEMICONDUCTOR BASED WAVELENGTH SELECTIVE PHOTODETECTOR FOR SUB-BANDGAP PHOTO DETECTION

(71) Applicant: THE UNIVERSITY OF HONG KONG, Hong Kong (CN)

(72) Inventors: Jinyao Tang, Hong Kong (CN); Ze Xiong, Hong Kong (CN); Jiawei Chen, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 0 days.

(21) Appl. No.: 16/996,374

(22) Filed: Aug. 18, 2020

(65) Prior Publication Data
US 2021/0005398 A1 Jan. 7, 2021

Related U.S. Application Data

(62) Division of application No. 15/614,975, filed on Jun. 6, 2017, now Pat. No. 10,755,866.
(Continued)

(51) Int. Cl.
*H01G 9/00* (2006.01)
*H01G 9/20* (2006.01)
(Continued)

(52) U.S. Cl.
CPC ............ *H01G 9/2059* (2013.01); *G01J 1/44* (2013.01); *G03F 7/0042* (2013.01); *G03F 7/2059* (2013.01); *H01G 9/0029* (2013.01); *H01G 9/209* (2013.01); *H01G 9/2045* (2013.01); *H01G 9/2095* (2013.01); *H01L 51/0003* (2013.01); *H01L 51/0097* (2013.01); *H01L 51/426* (2013.01); *H01L 51/428* (2013.01); *H01L 51/447* (2013.01); *H01L 51/448* (2013.01); *Y02P 70/50* (2015.11)

(58) Field of Classification Search
CPC .. H01G 9/0029; H01G 9/2059; H01G 9/2045; H01G 9/205; G03F 7/0042; G03F 7/2059; H01L 51/0003; H01L 51/426
USPC ....................................................... 250/214.1
See application file for complete search history.

(56) References Cited

U.S. PATENT DOCUMENTS 8,580,658 B1 * 11/2013 Davis .................. H01L 29/7781
438/478
2016/0126381 A1 5/2016 Wang et al.
(Continued)

OTHER PUBLICATIONS

Xia, F. et al., Ultrafast graphene photodetector, Nature Nanotechnology, Dec. 2009, 4:839-843.
(Continued)

*Primary Examiner* — Kevin K Pyo
(74) *Attorney, Agent, or Firm* — Saliwanchik, Lloyd & Eisenschenk (57) ABSTRACT

Graphene photodetectors capable of operating in the sub-bandgap region relative to the bandgap of semiconductor nanoparticles, as well as methods of manufacturing the same, are provided. A photodetector can include a layer of graphene, a layer of semiconductor nanoparticles, a dielectric layer, a supporting medium, and a packaging layer. The semiconductor nanoparticles can be semiconductors with bandgaps larger than the energy of photons meant to be detected.

11 Claims, 8 Drawing Sheets

Related U.S. Application Data (60) Provisional application No. 62/346,706, filed on Jun. 7, 2016.

(51) Int. Cl.

| | |
|---|---|
| *G01J 1/44* | (2006.01) |
| *G03F 7/004* | (2006.01) |
| *G03F 7/20* | (2006.01) |
| *H01L 51/00* | (2006.01) |
| *H01L 51/42* | (2006.01) |
| *H01L 51/44* | (2006.01) |

(56) References Cited

U.S. PATENT DOCUMENTS

| | | | |
|---|---|---|---|
| 2016/0142660 A1 | 5/2016 | Shen et al. | |
| 2017/0352492 A1* | 12/2017 | Tang | H01G 9/2095 |

OTHER PUBLICATIONS

Nair, R. R. et al., Fine Structure Constant Defines Visual Transparency of Graphene, Science, Jun. 6, 2008, 320:1308, The Authors.
Lemme, M. C. et al., Gate-Activated Photoresponse in a Graphene p-n Junction, Nano Letters, 2011, 11:4134-4137, 2011 American Chemical Society.
Mueller, T. et al., Graphene photodetectors for high-speed optical communications, Nature Photonics, May 2010, 4:297-301, 2010 Macmillan Publishers Limited.
Gabor, N. M. et al., Hot Carrier-Assisted Intrinsic Photoresponse in Graphene, Science, Nov. 4, 2011, 334:648-652.
Sun, D. et al., Ultrafast hot-carrier-dominated photocurrent in graphene, Nature Nanotechnology, Feb. 2012, 7:114-118, 2012 Macmillan Publishers Limited.
Tielrooij, K. J. et al., Generation of photovoltage in graphene on a femtosecond timescale through efficient carrier heating, Nature Nanotechnology, May 2015, 10:437-443, 2015 Macmillan Publishers Limited.
Konstantatos, G. et al., Hybrid graphene-quantum dot phototransistors with ultrahigh gain, Nature Nanotechnology, Jun. 2012, 7:363-368, 2012 Macmillan Publishers Limited.
Zhang, D. et al., Understanding Charge Transfer at PbS-Decorated Graphene Surfaces toward a Tunable Photosensor, Advanced Materials, 2012, 24:2715-2720, 2012 WILEY-VCH Verlag GmbH & Co. KGaA, Weinheim.
Kim, C. O. et al., High photoresponsivity in an all-graphene p-n vertical junction photodetector, Nature Communications, Feb. 12, 2014, 5:1-7, 2014 Macmillan Publishers Limited.
Klekachev, A V. et al., Electron accumulation in graphene by interaction with optically excited quantum dots, Physica E, 2011, 43:1046-1049, 2010 Elsevier B.V.
Shao, D. et al., Organic-Inorganic Heterointerfaces for Ultrasensitive Detection of Ultraviolet Light, Nano Letters, 2015, 15:3787-3792, 2015 American Chemical Society.
Dang, V. Q. et al., Ultrahigh Responsivity in Graphene-ZnO Nanorod Hybrid UV Photodetector, small, 2015, 11(25):3054-3065, 2015 Wiley-VCH Verlag GmbH & Co. KGaA, Weinheim.
Lee, Y. et al., High-Performance Perovskite-Graphene Hybrid Photodetector, Advanced Materials, 2015, 27:41-46, 2014 WILEY-VCH Verlag GmbH & Co. KGaA, Weinheim.
Chen, S. et al., Biologically inspired graphene-chlorophyll phototransistors with high gain, Carbon, 2013, 63:23-29, 2013 Elsevier Ltd.
Liu, C. et al., Graphene photodetectors with ultra-broadband and high responsivity at room temperature, Nature Nanotechnology, Apr. 2014, 9:273-278, 2014 Macmillan Publishers Limited.
Furchi, M. et al., Microcavity-Integrated Graphene Photodetector, Nano Letters, 2012, 12:2773-2777, 2012 American Chemical Society.
Gan, X. et al., Chip-integrated ultrafast graphene photodetector with high responsivity, Nature Photonics, Nov. 2013, 7:883-887, 2013 Macmillan Publishers Limited.
Echtermeyer, T.J. et al., Strong plasmonic enhancement of photovoltage in graphene, Nature Communications, Aug. 30, 2011, 2:1-5, 2011 Macmillan Publishers Limited.
Freitag, M. et al., Photocurrent in graphene harnessed by tunable intrinsic plasmons, Nature Communications, Jun. 3, 2013, 4:1-8, 2013 Macmillan Publishers Limited.
Chen, J. et al., Optical nano-imaging of gate-tunable graphene plasmons, Nature, Jul. 5, 2012, 487:77-81, 2012 Macmillan Publishers Limited.
Abergel, D.S. et al., Visibility of graphene flakes on a dielectric substrate, Applied Physics Letters, 2007, 91:1-4, 2007 American Institute of Physics.
Roddaro, S. et al., The Optical Visibility of Graphene: Interference Colors of Ultrathin Graphite on $SiO_2$. Nano Letters, 2007, 7(9):2707-2710, 2007 American Chemical Society.
Lien, D. et al., Engineering Light Outcoupling in 2D Materials, Nano Letters, 2015, 15:1356-1361, 2015 American Chemical Society.
Wang, Y. et al., Hybrid Graphene-Perovskite Phototransistors with Ultrahigh Responsivity and Gain, Advanced Optical Materials, 2015, 3:139-1396, 2015 WILEY-VCH Verlag GmbH & Co. KGaA, Weinheim.
Sumi, S. et al., Effect of $Cl^-$ and $Br^-$ Ions and pH on the Flatband Potentials of Silver Halide Sheet Crystal Electrodes, Bull. Chem. Soc. Jpm., Oct. 1980, 53(10):2742-2747, 1980 The Chemical Society of Japan.
Bose, D. N. et al., Physics of silver halides and their applications, Bull. Mater. Sci., Nov. 1980, 2(4):221-231.
Bauer, R. S. et al., Silver-halide valence and conduction states: Temperature-dependent ultraviolet-photoemission studies, Physical Review B, Nov. 15, 1976, 14(10):4539-4551.
Knight, M. W. et al., Photodetection with Active Optical Antennas, Science, May 6, 2011, 332:702-704.
Zheng, B. Y. et al., Distinguishing between plasmon-induced and photoexcited carriers in a device geometry, Nature Communications, Jul. 13, 2015, 6:1-7, 2015 Macmillan Publishers Limited.
Breusing, M. et al., Ultrafast Carrier Dynamics in Graphite, Physical Review Letters, 2009, 102:1-4, 2009 The American Physical Society.
Vanýsek, P., Electrochemical Series, CRC Handbook of Chemistry and Phsyics, 96th edition, 2015, CRC Press.
Dong, H. et al., Highly-effective photocatalytic properties and interfacial transfer efficiencies of charge carriers for the novel $Ag_2CO_3$/AgX heterojunctions achieved by surface modification, Dalton Transactions, 2014, 43:7282-7289, The Royal Society of Chemistry 2014.
Tani, T. Explanation of Photocatalytic Water Splitting by Silver Chloride from Viewpoint of Solid State Physics and Photographic Sensitivity of Silver Halides, J. Soc. Photogr. Sci. Technol. Japan, 2009, 72(2):88-94.
Office Action dated Sep. 5, 2019 in U.S. Appl. No. 15/614,975.
Notice of Allowance dated Apr. 22, 2020 in U.S. Appl. No. 15/614,975.

* cited by examiner

GRAPHENE-SEMICONDUCTOR BASED WAVELENGTH SELECTIVE PHOTODETECTOR FOR SUB-BANDGAP PHOTO DETECTION

CROSS-REFERENCE TO RELATED APPLICATIONS

This application is a divisional of U.S. patent application Ser. No. 15/614,975, filed Jun. 6, 2017, which claims the benefit of U.S. Provisional Application Ser. No. 62/346,706, filed Jun. 7, 2016, the disclosure of each of which is hereby incorporated by reference in its entirety including any tables, figures, or drawings.

FIELD OF INVENTION

The subject invention relates to a photodetector with the capability to operate in the sub-bandgap region relative to the bandgap of semiconductor nanoparticles. More specifically, the subject invention relates to the use of a graphene-semiconductor hybrid structure for photo detection in the wavelength beyond the wavelength corresponding to the semiconductor bandgap.

BACKGROUND OF THE INVENTION

Due to its superior electrical and optical properties, such as high carrier mobility and gapless band structure, graphene has been considered as a promising material to replace existing photoactive semiconductor materials for high speed, high sensitivity and broadband photo detection. See Xia F N, Mueller T, Lin Y M, Valdes-Garcia A, Avouris P., Ultrafast graphene photodetector. *Nat Nanotechnol* 4, 839-843 (2009) (hereinafter referred to as "Xia") and Nair R R, et al., Fine structure constant defines visual transparency of graphene. *Science* 320, 1308-1308 (2008) (hereinafter referred to as "Nair"), both of which are incorporated herein in their entirety. The photo response in a graphene-based photodetector is mainly attributed to three mechanisms: (i) the photovoltaic effect, (ii) the photothermoelectric effect, and (iii) the photogating effect. See Lemme M C, et al, Gate-Activated Photoresponse in a Graphene p-n Junction. *Nano Lett* 11, 4134-4137 (2011) (hereinafter referred to as "Lemme"); Mueller T, Xia F N A, Avouris P. Graphene photodetectors for high-speed optical communications. *Nat Photonics* 4, 297-301 (2010) ("Mueller"); Gabor N M, et al., Hot Carrier-Assisted Intrinsic Photoresponse in Graphene. *Science* 334, 648-652 (2011) (hereinafter referred to as "Gabor"); Sun D, et al., Ultrafast hot-carrier-dominated photocurrent in graphene. *Nat Nanotechnol* 7, 114-118 (2012) (hereinafter referred to as "Sun"); Tielrooij K J, et al., Generation of photovoltage in graphene on a femtosecond timescale through efficient carrier heating. *Nat Nano* 10, 437-443 (2015) (hereinafter referred to as "Tielrooij"); Konstantatos G, et al., Hybrid graphene-quantum dot phototransistors with ultrahigh gain. *Nat Nanotechnol* 7, 363-368 (2012) (hereinafter referred to as "Konstantatos"); and Zhang D Y, Gan L, Cao Y, Wang Q, Qi L M, Guo X F., Understanding Charge Transfer at PbS-Decorated Graphene Surfaces toward a Tunable Photosensor (hereinafter referred to as "Zhang"), all of which are incorporated herein in their entirety.

In addition to enhanced sensitivity, wavelength selectivity is a desirable characteristic for photodetector in certain applications. The spectral selectivity is determined by integrating microcavity, waveguide or metal plasmonic structures. See, Furchi M, et al., Microcavity-Integrated Graphene Photodetector. *Nano Lett* 12, 2773-2777 (2012) (hereinafter referred to as "Furchi"); Gan X T, et al., Chip-integrated ultrafast graphene photodetector with high responsivity. *Nat Photonics* 7, 883-887 (2013) (hereinafter referred to as "Gan"); and Echtermeyer T J, et al, Strong plasmonic enhancement of photovoltage in graphene. *Nat Commun* 2, (2011) (hereinafter referred to as "Echtemeyer"), all of which are incorporated herein in their entirety. Although, as in metal plasmonic structures, the intrinsic plasmonic absorption in graphene nanostructures is primarily determined by their geometry, the low density of states promises graphene the potential of tuning the light absorption by electrostatic gating. See, Freitag M, Low T, Zhu W J, Yan H G, Xia F N, Avouris P, Photocurrent in graphene harnessed by tunable intrinsic plasmons. *Nat Commun* 4, (2013) (hereinafter referred to as "Freitag") and Chen J N, et al., Optical nano-imaging of gate-tunable graphene plasmons. *Nature* 487, 77-81 (2012) (hereinafter referred to as "Chen 2"), both of which are incorporated herein in their entirety. However, in addition to the high cost associated with a nanofabrication process, all of these photodetectors rely on the intrinsic photo response of graphene, leading to a low responsivity of <1 $A \cdot W^{-1}$, which limits its potential applications. It is well known that the silicon oxide layer on silicon wafer can serve as a Fabry-Perot cavity, which is responsible for the optical visibility of single layer graphene. Abergel D S L, Russell A, Fal'ko V I, Visibility of graphene flakes on a dielectric substrate. *Applied Physics Letters* 91, 063125 (2007) (hereinafter referred to as "Abergel") and Roddaro S, Pingue P, Piazza V, Pellegrini V, Beltram F, The Optical Visibility of Graphene: Interference Colors of Ultrathin Graphite on SiO2. *Nano Lett* 7, 2707-2710 (2007) hereinafter referred to as ("Roddaro"), both of which are incorporated herein in their entirety.

BRIEF SUMMARY OF THE INVENTION

Embodiments of the subject invention provide devices and fabrication methods for a graphene photodetector that absorbs photons in a graphene layer in contrast to traditional semiconductor photodetectors. The photodetector of the subject invention is inspired by traditional silver halide photographic film, which enables a photo response to photons with sub-bandgap energy. Upon illumination, the graphene layer absorbs photons and hot electrons are generated in the graphene. These photon-excited hot electrons can transfer to the conduction band of the silver halide nanoparticles. The hot electrons promote a redox reaction in the silver halide, reducing $Ag^+$ to $Ag^0$. The $Ag^+$ serves as a chemical electron reservoir, which enhances the lifetime of trapped charge carriers and results in high responsivity of the photodetector. Due to the low absorbance of the graphene layer, the design enables a novel transparent visible light photodetector.

In an embodiment, the photodetector comprises a graphene channel, a layer of semiconductor nanoparticles, a supporting medium, and a packaging layer. The semiconductor nanoparticles act as the reservoir to store the photo carriers excited from the graphene and as a photogate for the graphene channel, leading to the change of conductance in the graphene layer. In an embodiment, this sub-bandgap absorption can also be realized by combining graphene with other form of semiconductors, such as semiconductor films.

Using the principles in Lien D H, et al., Engineering Light Outcoupling in 2D Materials. *Nano Lett* 15, 1356-1361 (2015) (hereinafter referred to as "Lien"), which is incorporated herein by reference in its entirety, an embodiment of the subject invention uses simple wavelength-selective enhancement techniques on the photodetector in order to provide large area modulation without complicated submicron fabrication techniques.

The semiconductor nanoparticles in an embodiment of the subject invention can be chemically modified or dye sensitized to adjust the absorption properties. The position of the semiconductor nanoparticles is not limited to the upper surface of the graphene. They can be covered by the graphene or mixed with graphene flakes from liquid exfoliation.

BRIEF DESCRIPTION OF THE DRAWINGS

The foregoing and other objects and advantages of the subject invention will become more apparent when considered in connection with the following detailed description and appended-drawings in which like designations denote like elements in the various views, and wherein:

FIGS. 1(a)-1(h) show images of a possible process flow for fabricating a photodetector device according to an embodiment of the subject invention, in which

FIGS. 2(a)-2(f) are an overview of the device according to the subject invention and the concepts upon which it is designed, in which

FIGS. 3(a)-3(c) show a photo response of AgCl/graphene device according to an embodiment of the subject invention on transparent substrates, in which

FIGS. 4(a)-4(c) are a wavelength-resolved photo response, in which

FIGS. 5(a)-5(c) are a FDTD simulation for a wavelength selective enhancement, in which

FIGS. 7(a)-7(f) show an AgCl-graphene photodetector and temporal photoresponse, in which

FIGS. 8(a)-8(d) show the spectral selectivity modulation characteristics of an embodiment of the subject invention, in which

DETAILED DISCLOSURE OF THE INVENTION

Embodiments of the subject invention provide novel and advantageous graphene photodetectors and fabrication methods thereof. In certain embodiments, photovoltaic electron-hole pairs generated in the graphene layer can be separated by the Schottky barrier at the graphene-semiconductor interphase. The photo generated electrons can be injected into the semiconductor nanoparticles and the holes left in the graphene channel alter the conductance of the graphene channel so as to generate a response signal. The semiconductor nanoparticles can act as reservoirs for the photo generated electrons.

Due to its gapless band structure, the photo-generated exciton in graphene recombines in the sub-picosecond time scale (see, for example, Xia). As a result, it is necessary to employ a built-in electric field to dissociate electron-hole pairs in order to show pronounced photovoltaic effect. This electric field is usually established by chemical doping, electrostatic gating or contact with metal of a different work function. See Kim C O, et al., High photoresponsivity in an all-graphene p-n vertical junction photodetector. *Nat Commun* 5, (2014) (hereinafter referred to as "CO"), which is incorporated herein in its entirety.

Accompanying the photovoltaic effect, a photo-thermoelectric effect will also occur when light is absorbed around the p-n junction of graphene. Unfortunately, due to its small photoactive area or insignificant Seebeck coefficient difference, together with the weak light absorption (~2.3%) of intrinsic graphene, the overall responsivity of related art graphene photodetectors are less than 100 mA·W$^{-1}$ (see, for example, Xia and Nair). In contrast, ultra-high photoconductive gain can be obtained by the photogating effect in graphene hybrid phototransistors. See Konstantatos, Zhang and Klekachev A V, Cantoro M, van der Veen M H, Stesmans A L, Heyns M M, De Gendt S., Electron accumulation in graphene by interaction with optically excited quantum dots. *Physica E: Low-dimensional Systems and Nanostructures* 43, 1046-1049 (2011) (hereinafter referred to as "Klekachev"), which is incorporated herein in its entirety.

In the case of photogating, semiconductor quantum dots or organic dye molecules serve as a light absorbing layer for photo-carrier generation. Upon illumination, photon excited charge carriers are injected into the graphene underneath and the rest of the oppositely charged carriers trapped in the quantum dots or dye layer can modulate the conductance of graphene by capacitive coupling. Due to the long lifetime of trapped carriers ($\tau_{lifetime}$) in the quantum dot layer, extraordinary responsivity, up to $10^7$ A·W$^{-1}$, has been realized in this hybrid structure. As described in this proposed mechanism, the photo response of the hybrid transistor originates from photoexcitation of the incorporated photoactive absorber other than the graphene itself. It seems like the spectral response of the hybrid photodetector is fundamentally limited by the absorption of incorporated quantum dots or dyes as shown in PbS-graphene, ZnO-graphene, perovskite-graphene and chlorophyll-graphene hybrids. See Konstantatos, Shao D, et al., Organic-Inorganic Heterointerfaces for Ultrasensitive Detection of Ultraviolet Light. *Nano Lett* 15, 3787-3792 (2015) (hereinafter referred to as "Shao"); Dang V Q, et al., Ultrahigh Responsivity in Graphene-ZnO Nanorod Hybrid UV Photodetector. *Small* 11, 3054-3065 (2015) ("Dang"); Lee Y, et al., High-Performance Perovskite-Graphene Hybrid Photodetector. *Adv Mater* 27, 41-46 (2015) (hereinafter referred to as "Lee"); and Chen S-Y, et al., Biologically inspired graphene-chlorophyll phototransistors with high gain. *Carbon* 63, 23-29 (2013) (hereinafter referred to as "Chen"), all of which are incorporated herein in their entirety.

In order to fully benefit from the broad absorption spectrum of graphene, a double-layer graphene device can use two layers of graphene that are isolated by a thin dielectric barrier. See, Liu C H, Chang Y C, Norris T B, Zhong Z H, Graphene photodetectors with ultra-broadband and high responsivity at room temperature. *Nat Nanotechnol* 9, 273-278 (2014) (hereinafter referred to as "Liu"), which is incorporated herein in its entirety. The trapped charges in the top graphene layer can impose a photogating effect on the bottom graphene layer, bringing in a high responsivity of ~1000 A·W$^{-1}$ at 532 nm and ~1 A·W$^{-1}$ in the mid-infrared range. However, the complicated device structure and requirement of using high reset back-gate voltage pulses synchronized with the external light input signal may limit its potential application.

Embodiments of the subject invention overcome the problems of the related art and enable sub-bandgap photo detection with enhanced responsivity compared to pure semiconductor-based photodetectors. According to embodiments of the subject invention, a dielectric layer can be modulated to realize large scale wavelength selective enhancement and function as a key component in flexible and transparent optoelectronics for imaging, spectroscopy, sensing and optical communications.

In an embodiment of the subject invention, a photodetector can comprise a layer of graphene, a layer of semiconductor nanoparticles, a supporting medium, and a packaging layer. Novel features include (a) sub-bandgap absorption, (b) wavelength selective enhancement, (c) flexibility, and (d) transparency. In an embodiment, the photodetector can be in the form of AgX/graphene, where X=Cl, Br, or I. For example, the silver halide can be AgCl. The supporting medium can comprise one or more of the following: quartz; thermal oxidized Si; sapphire; silicon carbide; aluminum nitride; polydimethylsiloxane; and flexible plastic substrates (such as polyester, polyimide, polyethylene naphthalate, polyetherimide, and fluoropolymers et al.).

Photodetector Fabrication.

Figure 1A:
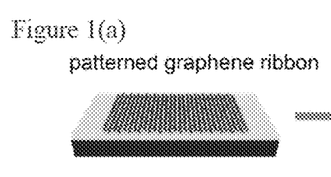
FIG. 1(a) shows CVD grown graphene on a substrate (Si or quartz) patterned into ribbons using e-beam lithography and oxygen RIE.
Figure 1B:
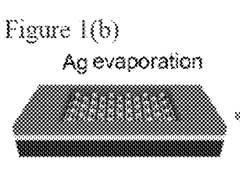
FIG. 1(b) illustrates 0.5 nm Ag deposited on the central area of the graphene ribbon by thermal deposition.
Figure 1C:
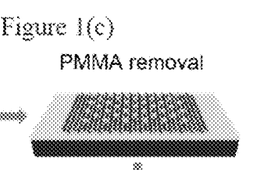
FIG. 1(c) shows the removal of PMMA by a mixture of dichloroethene and acetone.

As shown in FIGS. 1(a)-1(h), in an embodiment of the subject invention, a monolayer chemical vapor deposition ("CVD") graphene on copper is spin-coated (4,000 rpm for 1 minute) with 7 wt. % Poly(methyl methacrylate) (PMMA) solution in anisole and dried in air. The graphene on the reverse side of copper is removed through oxygen reactive ion etching (RIE) for approximately 2 min. The copper is then removed by chemically etching the copper in 0.1 M (NH$_4$)$_2$S$_2$O$_8$ aqueous solution. The released graphene, which is now attached on the PMMA film, is mechanically removed and rinsed consecutively in several clean deionized ("DI") water baths. Finally, the film is applied to a clean silicon substrate with 470 nm or 200 nm thermal oxide, quartz or polyethylene terephthalate (PET) film and dried in air. After dissolving the PMMA with acetone, the graphene is patterned into a ribbon with e-beam lithography and oxygen, as seen in FIG. 1(a). 0.5 nm Silver (Ag) nanoparticles are deposited onto the graphene by thermal evaporation. Electronic beam lithography is used to pattern a central area of the graphene into micro-ribbons, as seen in FIG. 1(b). FIG. 1(c) shows the removal of PMMA by a mixture of dichloroethene and acetone.

Figure 1D:
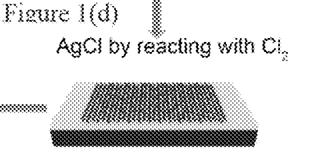
FIG. 1(d) shows the transformation of the Ag into AgCl by a reaction with $Cl_2$.

In an embodiment, gas-solid reactions are used to synthesize the Ag nanoparticles into silver chloride (AgCl) nanoparticles. In particular, FIG. 1(d) shows the transformation of the Ag into AgCl by a reaction with chlorine (Cl$_2$). A 5 mL glass vial with the sample substrate is covered by a layer of silica gel and placed in a sealed 25 mL glass vial with 0.05 g solid potassium chlorate (KClO$_3$.) Then 0.15 mL of 37% hydrochloric acid (HCl) solution is added to the solid and the Cl$_2$ is generated in-situ (KClO$_3$+6HCl=KCl+5Cl$_2$+3H$_2$O) and allowed to react with the evaporated Ag nanoparticles for 10 minutes at room temperature.

In an embodiment, in order to synthesize silver bromide (AgBr) to fabricate AgBr/graphene, the following steps were taken. A 5 mL glass vial with a sample substrate is covered by a layer of silica gel and placed in a sealed 25 mL glass vial with 0.05 g solid potassium bromide (KBr). Then 0.15 mL of solid potassium permanganate (KMnO$_4$) and 98% sulfuric acid (H$_2$SO$_4$) mixture solution is added to the solid and Br$_2$ vapor is produced by the reaction (2KMnO$_4$+8H$_2$SO$_4$+10KBr=6K$_2$SO$_4$+5Br$_2$+2MnSO$_4$+8H$_2$O) and allowed to react with Ag nanoparticle for approximately 10 minutes at room temperature.

In an embodiment, in order to synthesize silver iodide (AgI) for a AgI/graphene photodetector, the sample substrate is placed in a sealed 30 mL glass vial containing 0.05 g of solid iodine (I$_2$). Then the reaction vial is heated to 105° C. to allow the I$_2$ vapor to react with Ag nanoparticles for 10 minutes. After the reaction, 5 nm of Al$_2$O$_3$ is coated by atomic layer deposition (ALD) using trimethylaluminum as a precursor at 70° C. The $Al_2O_3$ minimizes the influence of ambient gas molecule adsorption and desorption upon illumination.

Figure 1E:
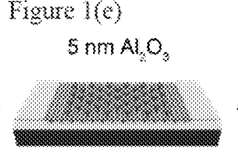
FIG. 1(e) illustrates the coating of the sample with 5 nm $Al_2O_3$.
Figure 1F:
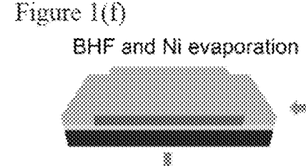
FIG. 1(f) shows that after removing the $Al_2O_3$ on the contact area the devise is dipped into a buffered HF solution (BHF) and nickel (Ni) is sputtered on as the electrodes.
Figure 1G:
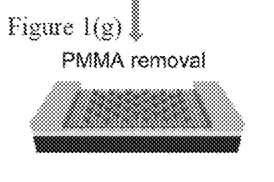
FIG. 1(g) shows cleaning of the PMMA by a mixture of dichloroethene and acetone and FIG. 1(h) is a top view of the finished photodetector.
Figure 1H:
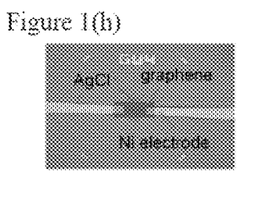

FIG. 1(e) illustrates the coating of the sample with 5 nm aluminum oxide ($Al_2O_3$) in an embodiment of the subject invention. The $Al_2O_3$ on the contact area is removed by dipping it in 5:1 buffered HF solution (BHF) for 1 second, and a 100 nm nickel (Ni) electrode is patterned on the graphene ribbon with c-beam lithography followed by metal sputtering. In particular, FIG. 1(f) shows that after removing the $Al_2O_3$ on the contact area the device is dipped it into a buffered HF solution (BHF) and nickel (Ni) is sputtered on as the electrodes. FIG. 1(g) shows cleaning of the PMMA by a mixture of dichloroethene and acetone and FIG. 1(h) is an optical image of the finished photodetector.

The Mechanism of the Graphene Photodetector

Figure 2A:
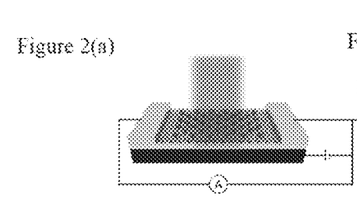
FIG. 2(a) shows an image of a schematic of a AgCl/graphene photodetector according to an embodiment of the subject invention.
Figure 2B:
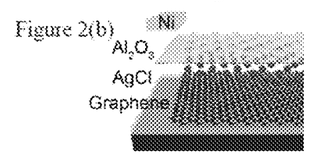
FIG. 2(b) is an image of an exploded view of a graphene photodetector according to an embodiment of the subject invention.

For a graphene photodetector, many semiconductor materials with various band gap energy levels, such as ZnO ($E_g$ ~3.3 eV), organolead halide perovskite ($CH_3NH_3PbX_3$, $E_q$ ~1.5 eV) and PbS ($E_g$ ~0.37 eV), have been hybridized with graphene and shown to exhibit extraordinary sensitivity enhancement over pristine graphene (see, for example, Lee and Wang Y, et al., Hybrid Graphene-Perovskite Phototransistors with Ultrahigh Responsivity and Gain. *Advanced Optical Materials* 3, 1389-1396 (2015) (hereinafter referred to as "Wang"), which is incorporated herein in its entirety. In those designs, since the semiconductor is responsible for the photon absorption, the responsivity spectrum of the photodetector aligns with the absorption spectrum of the incorporated semiconductor. In an embodiment of the subject invention, this limitation can be overcome with a silver halide-graphene hybrid system, wherein the graphene itself serves as the photosensitizer by injecting excited hot carrier electrons into the conduction band of a silver halide and using a reversible $Ag^+/Ag^0$ redox couple as a reservoir for said hot carrier electrons. This innovation enables a strong photo response for long wavelength photons beyond the absorption edge of an incorporated semiconductor. A schematic of a silver halide-graphene hybrid photodetector is shown in FIG. 2(a) and FIG. 2(b) in an embodiment of the subject invention. The single layer chemical vapor deposition (CVD) grown graphene is in contact with a layer of well-dispersed silver chloride (AgCl) nanoparticles. Due to its work function ($\Phi_{AgCl}$=4.8 eV) and band structure ($E_q$=3.25 eV, $E_C$=4.3 eV and $E_V$=7.55 eV), a Schottky barrier is formed at the AgCl-graphene interface. See, Seiichi Sumi T W, Akira Fujishima, Kenichi Honda, Effect of Cl- and Br-Ions and pH on the Flatband Potentials of Silver Halide Sheet Crystal Electrodes. *B Chem Soc Jpn* 53, 2742-2747 (hereinafter referred to as "Sumi"); Bose D N, Govindacharyulu P A., Physics of silver halides and their applications. *Bull Mater Sci* 2, 221-231 (1980) (hereinafter referred to as "Bose"); and Bauer R S, Spicer W E, Silver-halide valence and conduction states: Temperature-dependent ultraviolet-photoemission studies. *Phys Rev B* 14, 4539-4550 (1976) (hereinafter referred to as "Bauer"), all of which are incorporated herein in their entirety.

The as-prepared device with a p-type doped ($\Delta E_F$ shift of fermi level from the Dirac point $\Phi_g^0$) graphene generates electron-hole pairs upon photoexcitation, according to an embodiment of the subject invention. The photo-generated electrons are injected through the Schottky barrier into AgCl nanoparticles and stored in $Ag^+$, reducing it to Ag. The holes left in the graphene channel increase the $\Delta E_F$ and shift the graphene fermi level to a more p-type position, changing the conductance of the graphene channel through the photogating effect. The visible light illumination cannot generate photocarriers from AgCl particles due to its large band gap (3.25 eV), highlighting the sub-bandgap absorption in the graphene-AgCl heterostructure.

Figure 2C:
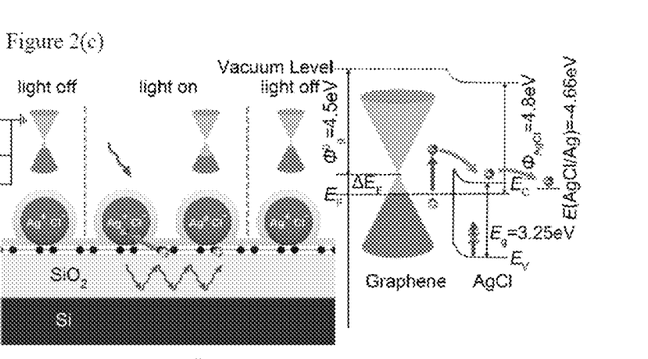
FIG. 2(c) shows a schematic of a photocarrier generation mechanism.

As a photon is absorbed by graphene, hot electron-hole pairs are generated and separated by the built-in field in the Schottky barrier at the graphene-semiconductor interface (see, for example, FIG. 2(c)), largely preserving the merits of gapless band structure and gate tunability of pristine graphene. See, Knight M W, Sobhani H, Nordlander P, Halas N J, Photodetection with Active Optical Antennas. *Science* 332, 702-704 (2011) (hereinafter referred to as "Knight"); and Zheng B Y, Zhao H, Manjavacas A, McClain M, Nordlander P, Halas N J, Distinguishing between plasmon-induced and photoexcited carriers in a device geometry. *Nat Commun* 6, (2015) (hereinafter referred to as "Zheng"), which are incorporated herein in their entirety. Due to the gapless band structure of graphene and the ultrafast intra-band recombination of photo-generated electrons, low hot carrier injection efficiency is expected after excitation. See, Breusing M, Ropers C, Elsaesser T, Ultrafast Carrier Dynamics in Graphite. *Phys Rev Lett* 102, 086809 (2009) (hereinafter referred to as "Breusing"), which is incorporated herein in its entirety. Nevertheless, a small portion of hot electrons with sufficient energy can be injected into the conduction band of AgCl and promote the reduction of $Ag^+$ to $Ag^0$ with $E(Ag^+/Ag^0)$=4.66 eV. Vanýsek P, *CRC Handbook of Chemistry and Physics, 96th ed*. CRC Press (2015) (hereinafter referred to as "Vanýsek"), which is incorporated herein in its entirety. This negatively charged AgCl layer then modulates the conductance of the graphene channel through the photogating effect. In this mechanism, the $Ag^+/Ag^0$ redox couple serves as a reversible chemical electron reservoir and electrons are stored in Ag nanoparticles, which are spatially separated from the graphene layer. Compared with previously reported lead sulfide (PbS) and zinc oxide (ZnO) hybrid systems, the existence of spatially separated chemical electron reservoirs significantly stabilizes the injected electrons and promotes the sensitivity of low energy photons beyond the band gap limit of the semiconductor. Such results not only offer a new paradigm of sub-bandgap absorption in a low Schottky barrier graphene-semiconductor heterostructure, but they also pave the way for developing chemically adjustable optoelectronic systems based on other 2D layered materials. This hybrid graphene-based device is envisaged to be important for flexible and transparent optoelectronics for imaging, spectroscopy, sensing and optical communications.

Figure 2D:
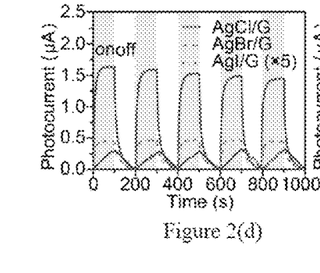
FIG. 2(d) shows an image of a plot of temporal photo response of a device according to the an embodiment of subject invention.

According to an embodiment of the subject invention, the temporal response to white light of the AgCl/graphene photodetector is shown in the FIG. 2(d) for a device prepared with AgX/graphene (470 nm $SiO_2$) photodetectors (X=Cl, Br, I) with the same ~54.9 μW white light over the 22×16 μm² graphene channel area. The photocurrent of AgI/graphene has been increased 5 times for clarity. The photocurrent is recorded by subtracting the dark current from the light current, which gradually decreases from AgCl to AgBr and AgI, under the same illumination power ~54.9 μW from a white LED on the graphene channel area (channel length of 22 μm and width of 16 μm). This decrease of responsivity from AgCl to AgI could be attributed to the increased conduction band edge and subsequently higher Schottky barrier or the lower reduction efficiency of $Ag^+/Ag^0$ caused by the smaller drift mobility of the photoelectrons in AgBr and AgI. See, Dong H, et al., Highly-effective photocatalytic properties and interfacial transfer efficiencies of charge carriers for the novel $Ag_2CO_3$/AgX heterojunctions achieved by surface modification, *Dalton Trans* 43, 7282-7289 (2014) (hereinafter referred to as "Dong") and Tani T, Explanation of Photocatalytic Water Splitting by Silver Chloride from Viewpoint of Solid State Physics and Photographic Sensitivity of Silver Halides, *Journal of The Society of Photographic Science and Technology of Japan* 72, 88-94 (2009) (hereinafter referred to as "Tani"), which are incorporated herein in their entirety.

The subject invention includes, but is not limited to, the following exemplified embodiments.

Embodiment 1. A photodetector comprising:
a supporting medium;
a layer of graphene;
a layer of semiconductor nanoparticles; and
a packaging layer.

Embodiment 2. The photodetector of embodiment 1, wherein the semiconductor nanoparticles are on the graphene layer.

Embodiment 3. The photodetector of any of embodiments 1-2, wherein the semiconductor nanoparticles are covered by the graphene layer.

Embodiment 4. The photodetector of any of embodiments 1-3, wherein the semiconductor nanoparticles are mixed with graphene flakes.

Embodiment 5. The photodetector of any of embodiments 1-4, wherein the diameter of semiconductor nanoparticles can vary from the nanometer range to the micrometer range.

Embodiment 6. The photodetector of any of embodiments 1-5, wherein the semiconductor nanoparticles are semiconductors with bandgaps larger than the aimed energy of photons.

Embodiment 7. The photodetector of any of embodiments 1-6, wherein silver halide nanoparticles are used for detecting photons in a sub-bandgap region.

Embodiment 8. The photodetector of any of embodiments 1-7, wherein the semiconductor nanoparticles are sensitized by organic or inorganic dyes so as to modulate their properties.

Embodiment 9. The photodetector of any of embodiments 1-8, wherein the supporting medium is integrated with a photonic structure, such as a micro cavity, waveguide, or metal plasmonic structure, to modulate the performance of the device.

Embodiment 10. The photodetector of any of embodiments 1-9, wherein the packaging layer is an organic or inorganic layer with sufficient transmittance in the aimed range of detection.

Embodiment 11. The photodetector of any of embodiments 1-10, wherein the thickness of the supporting medium or packaging layer is modulated to achieve selective enhancement of photo detection.

Embodiment 12. The photodetector of any of embodiments 1-11, which is used in at least one of the following: flexible and transparent optoelectronics for imaging, spectroscopy, sensing, and optical communications.

Embodiment 13. A method of manufacturing a graphene semiconductor photodetector, the method comprising:
providing a monolayer chemical vapor deposition ("CVD") graphene on a metal (e.g., copper);
spin-coating a poly(methyl methacrylate) (PMMA) solution in anisole onto the graphene layer and air drying it;
removing the metal (e.g., copper) on the reverse side of the graphene;
scooping out the released graphene on the PMMA film and rinsing the film in at least one deionized ("DI") water bath (e.g., several DI water baths);
placing the film onto a clean substrate and air drying it;
dissolving the PMMA with a solvent (e.g., acetone);
patterning the graphene into a ribbon with e-beam lithography and oxygen;
depositing silver by thermal evaporation in a defined central area of the graphene ribbon;
chemically converting the silver into a silver halide;
after the chemical conversion of the silver into the silver halide, coating the structure with $Al_2O_3$;
removing the $Al_2O_3$ on the contact area, and patterning nickel (Ni) onto the contact area; and
cleaning of the PMMA.

Embodiment 14. The method of embodiment 13, wherein the step of coating $Al_2O_3$ utilizes trimethylaluminum as a precursor.

A greater understanding of the subject invention and of its many advantages may be had from the following examples, given by way of illustration. The following examples are illustrative of some of the methods, applications, embodiments and variants of the subject invention. They are, of course, not to be considered as limiting the invention. Numerous changes and modifications can be made with respect to the invention.

Example 1

Figure 2E:
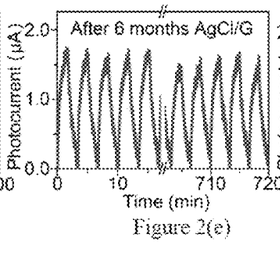
FIG. 2(e) shows an image of a plot of a photocurrent response of a device according to an embodiment of the subject invention after 6 months storage in ambient conditions and FIG. 2(f) shows a plot of the photocurrent dependence on back-gate voltage from −200 V to 200 V for an embodiment of the subject invention.
Figure 2F:
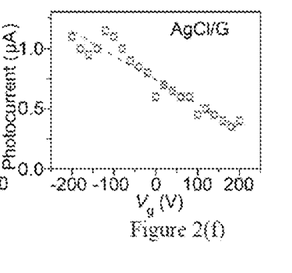

To examine the stability of the device according to an embodiment of the subject invention, an AgCl/graphene sample was stored in ambient air and illumination conditions for 6 months and subjected to a stress test continuously for 12 hours, i.e., a 12 hour temporal photo response test of AgCl/graphene (470 nm $SiO_2$) photodetectors with ~54.9 μW white light over the 22×16 μm² graphene channel area. As shown in FIG. 2(*e*), the photocurrent exhibited no significant loss after 6 month storage and during stress test. It is worth mentioning that the photo response of this graphene photodetector can be modulated with an external gate bias. As shown in FIG. 2(*f*), higher photo response is observed under negative gate voltage Vs, which can be attributed to the longer lifetime of trapped charges in an AgCl layer due to a higher Schottky barrier height with lower graphene Fermi level. In particular, FIG. 2(*f*) illustrates the photocurrent dependence on back-gate voltage from −200 V to 200 V.

Example 2

AgCl/Graphene on Transparent Substrates

Figure 3A:
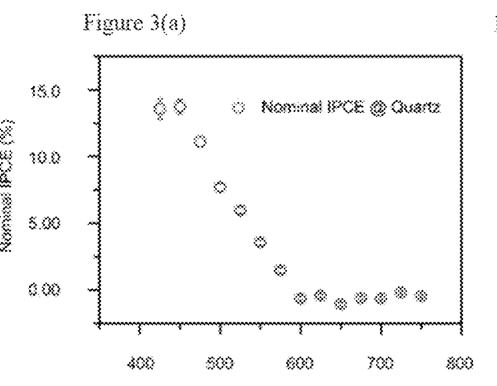
FIG. 3(a) shows a plot of the photon-to-current efficiency of a AgCl/graphene device on quartz as a function of excitation wavelength at 1V bias.
Figure 3B:
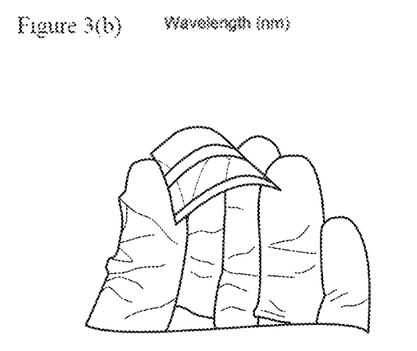
FIG. 3(b) shows an image of a flexible AgCl/graphene photodetector on PET film.
Figure 3C:
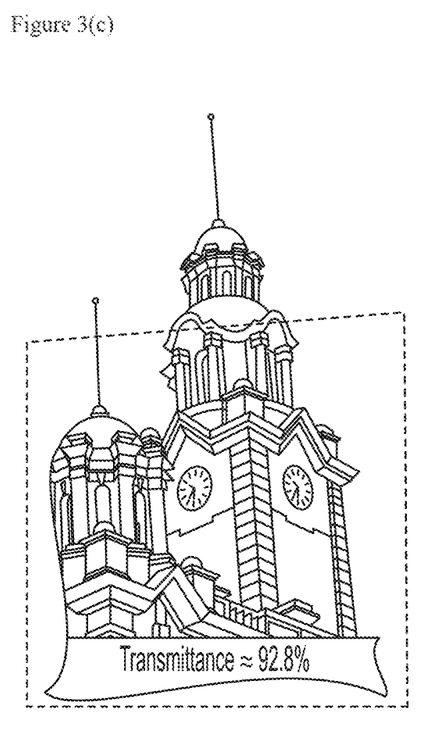
FIG. 3(c) shows an image of a building through flexible AgCl/graphene photodetector on PET film.

In order to explore the wavelength-dependent photo response of AgCl/graphene photodetector, the AgCl/graphene device, according to an embodiment of the subject invention, was fabricated on a quartz substrate and measured with a supercontinuum laser. FIG. 3(*a*) shows the photon-to-current efficiency η, which results from the ratio between the numbers of electrons over the Schottky barrier multiplied by the gain value to the number of incident photons. The wavelength dependence of η can be explained by the Fowler theory, which describes the photon energy dependent probability of photoelectrons being injected over the Schottky barrier at the semiconductor-metal interface, resembling the AgCl-graphene interface in the subject invention. Knight provides support for this proposition. In Fowler theory, the energy-dependent photoemission probability $$\eta_i \approx C_F \frac{(h\nu - q\Phi_B)^2}{h\nu},$$

where $C_F$ is the device-specific Fowler emission coefficient, hv is the photon energy, and $q\Phi_B$ is the Schottky barrier energy. The increase of η with decreasing wavelength can be understood by considering the higher $\eta_i$ with increasing photon energy. The deviation of q from the quadratic increase of $\eta_i$ in Fowler theory may partially benefit from the hot carrier multiplication by virtue of the slow acoustic phonon cooling time in graphene (~10 ns) (see, for example, Sun.) A flexible visible photodetector can be fabricated on polyethylene terephthalate (PET) film. See FIG. 3(b), which is an image of a flexible AgCl/graphene photodetector on PET film being held between a person's fingers. Due to low light absorbance of graphene and the ultrathin AgCl layer, high transmittance ~92.8% was recorded under natural direct sun light illumination condition. The area of AgCl/graphene is indicated in FIG. 3(b) by a dashed line.

Example 3

Wavelength-Resolved Photo Response on Thermal Oxide

Figure 4A:
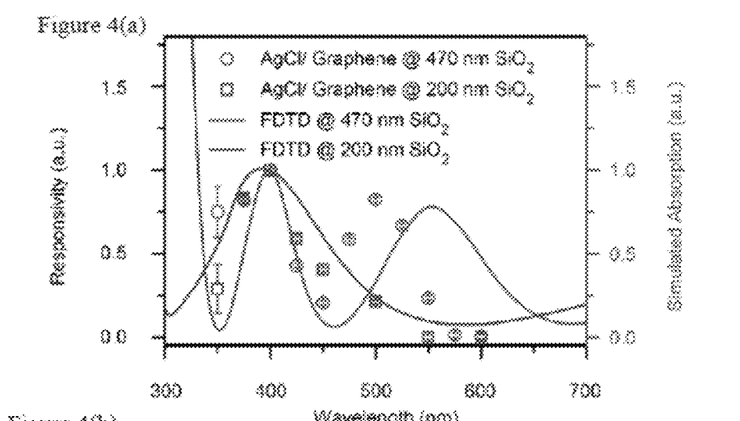
FIG. 4(a) shows a plot of the responsivity of a AgCl/graphene device on 470 nm $SiO_2$ as a function of excitation wavelength.
Figure 5A:
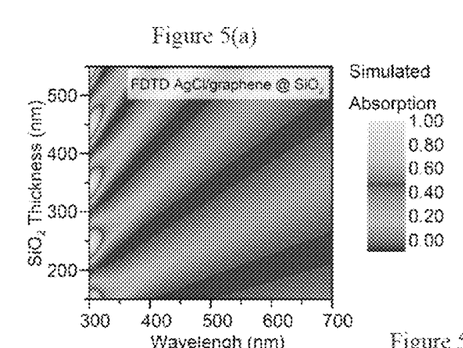
FIG. 5(a) shows a plot of a normalized intensity map of an absorption cross section for AgCl/graphene as a function of both the excitation wavelength and the $SiO_2$ thickness.
Figure 5B:
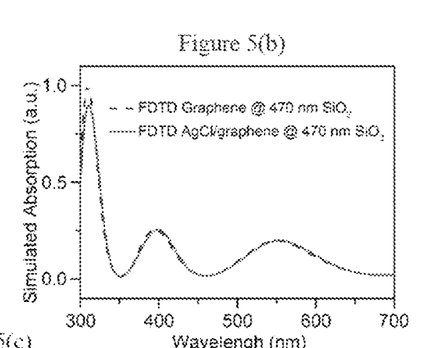
FIG. 5(b) shows a graph comparing the absorption cross section spectra of AgCl/graphene with pure graphene on a 470 nm thick $SiO_2$ substrate.
Figure 5C:
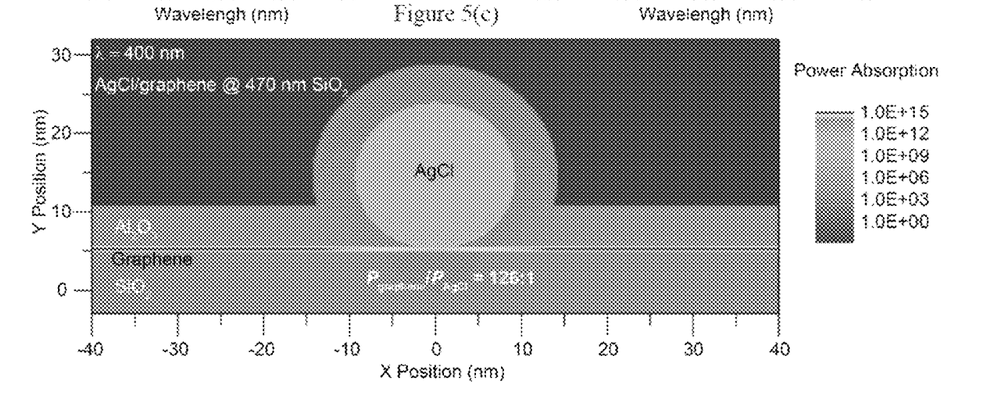
FIG. 5(c) shows a plot of the power absorption per unit area plot for an AgCl/graphene device on 470 nm $SiO_2$ at 400 nm wavelength.
Figure 6:
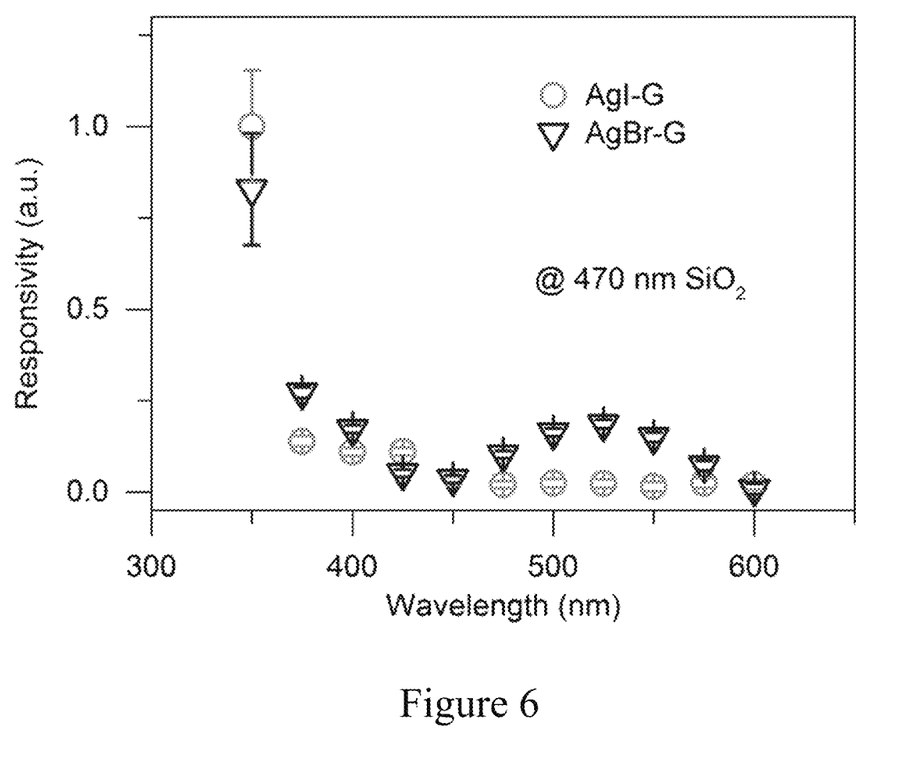
FIG. 6 shows a plot of the responsivity versus wavelength for AgL/graphene and AgBr/graphene.

It is well known that single layer graphene is visible on a silicon wafer with appropriate thermal oxide due to light interference inside and underneath the dielectric layers. In an embodiment of the subject invention, graphene itself is responsible for light absorption; the spectral response of a graphene photodetector can be selectively enhanced by modulating the thickness underneath the dielectric layer, which creates a color-sensitive photodetector. The wavelength-dependent responsivity of the AgCl/graphene photodetector on 200 nm and 470 nm thermal oxide are shown respectively in FIG. 4(a) at a 1V bias (circles for 470 nm $SiO_2$ and squares for 200 nm $SiO_2$, left axis) and Finite-difference Time-domain ("FDTD") simulated absorption spectra (solid line for 470 nm $SiO_2$ and dashed line for 200 nm $SiO_2$, right axis). All the data are normalized by the value at 400 nm wavelength individually. Different dielectric layer thicknesses lead to dramatically different wavelength responses. The experimental photo response peaks match well with the absorption peaks obtained by the FDTD simulation. In contrast to the response spectrum of AgCl/graphene, the photo-response peak at 400 nm in AgBr/graphene and the AgI/graphene spectrum will merge with the band absorption of AgBr ($E_g$=2.69 eV) and AgI ($E_g$=2.83 eV) (see, for example, FIG. 6). FIG. 6 is a graph of responsivity versus wavelength for AgI/graphene (circle) and AgBr/graphene (inverted triangle). This in turn confirms that the absorption at 400 nm and beyond are due to graphene absorption rather than the band gap absorption of AgCl ($E_g$=3.25 eV) (see, for example, Bose.) In particular, FIGS. 5(a)-5(c) are a FDTD simulation for a wavelength selective enhancement where FIG. 5(a) is a normalized intensity map of an absorption cross section for AgCl/graphene as a function of both the excitation wavelength and the $SiO_2$ thickness, FIG. 5(b) is a graph comparing the absorption cross section spectra of AgCl/graphene with pure graphene on a 470 nm thick $SiO_2$ substrate, and FIG. 5(c) shows the power absorption per unit area plot for an AgCl/graphene device on 470 nm $SiO_2$ at 400 nm wavelength.

It is expected that other wavelength-selective enhancement techniques, such as photonic structure, waveguide, micro-cavity, and metal plasmonic enhancement, can also be applied to an embodiment of the subject invention, which promises great flexibility for designing color-sensitive photodetectors.

Figure 4B:
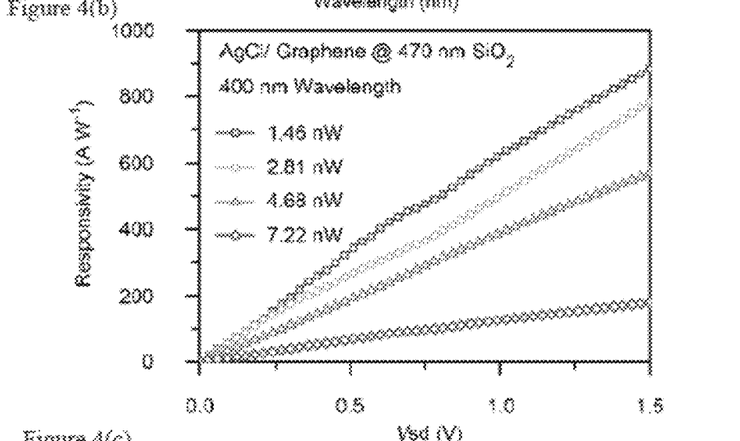
FIG. 4(b) shows a plot of the responsivity of the AgCl/graphene device on 470 nm $SiO_2$ as a function of source-drain bias ($V_{sd}$) measured under varying illuminating power at 400 nm wavelength.
Figure 4C:
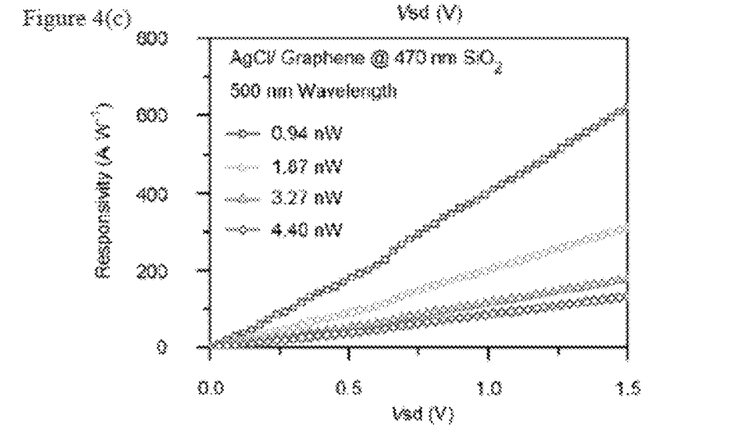
FIG. 4(c) shows a plot of the responsivity of the AgCl/graphene device on 470 nm $SiO_2$ as a function of bias $V_{sd}$ measured under varying illuminating power at 500 nm wavelength.

The responsivity of AgCl/graphene on 470 nm $SiO_2$ at 400 nm and 500 nm wavelengths, respectively, as a function of applied bias Vi are shown in FIG. 4(b) and FIG. 4(c), respectively. A high peak responsivity of ~880 A·W$^{-1}$ and ~620 A·W$^{-1}$ can be obtained with 1.46 nW (400 nm incident light) and 0.94 nW (500 nm incident light) optical power respectively on the channel area (22×16 μm$^2$) and 1.5 V. The value for $V_{sd}$ is around 10 times higher than that of a commercial Si-avalanche photodiode and could be further improved with higher $V_{sd}$. The high photo responsivity in the photodetector in an embodiment of the subject invention maybe due to the high photoconductive gain created by recirculating of holes in the graphene channel within the lifetime of the photo-generated electrons stored in the Ag$^+$/Ag$^0$ reservoir. It is notable that a higher responsivity is obtained under lower light intensity because the filling of the Ag$^+$/Ag$^0$ reservoir will decrease the probability of capturing photo-generated electrons. Thus, the excessive photo-generated electrons will recombine with the holes in the graphene channel quickly and shorten the average $\tau_{lifetime}$ and diminish the gain and responsivity value, as observed in ZnO-graphene system (see, for example, Shao).

Example 4

Figure 7A:
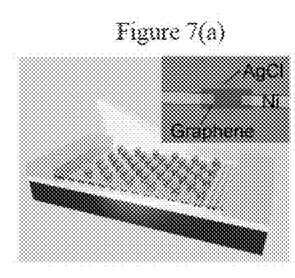
FIG. 7(a) shows the schematic diagram of the silver halide-graphene photodetector.

In order to examine the Ag metal plasmonic contribution to the device, phototransistors using silver halide-graphene hybrid (AgX-G, X=Cl, Br, I), as depicted in the schematic diagram FIG. 7(a), were fabricated. The degenerately p-doped Si substrate with 470 nm thermal oxide was used as back-gate electrode to modulate the Fermi level of the AgX-G hybrid. The well-dispersed silver nanoparticles were deposited on the CVD graphene by thermal evaporation. Then the Ag nanoparticles were completely converted into AgX nanoparticles by allowing the Ag nanoparticles to react with respective halogen gas ($2Ag_{(s)} + X_{2(g)} \rightarrow 2AgX_{(s)}$) as observed in X-ray photoelectron spectroscopy. After reaction, the AgX nanoparticles are well-dispersed on the graphene surface with average diameter ~18 nm. Finally, 5 nm $Al_2O_3$ was coated over the device surface with atomic layer deposition (ALD) to minimize the influence of ambient gas molecule adsorption and desorption upon illumination. In order to estimate the possible contribution of the plasmonic absorption from the trace amount of unreacted Ag metal on the graphene surface, a control device was fabricated with silver nanoparticles over graphene surface. As no detectable photoresponse was observed in this control sample, it is safe to conclude that the Ag metal plasmonic contribution to the photoresponse in in an embodiment of the subject invention is insignificant.

Example 5

Figure 7B:
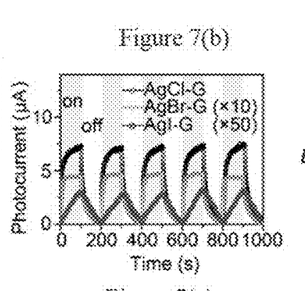
FIG. 7(b) shows a temporal photoresponse of the as-prepared AgX-G hybrid photodetectors.
Figure 7C:
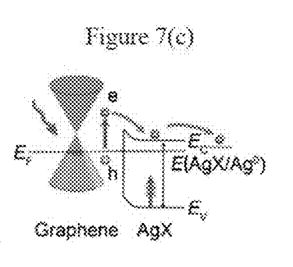
FIG. 7(c) shows an energy band diagram at the junction formed by graphene and semiconducting AgX.
Figure 7D:
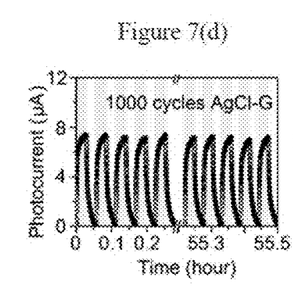
FIG. 7(d) shows a long time (1000 cycles) temporal photoresponse of AgCl-G photodetector, after six months preservation under ambient conditions.

The photoresponse of hybrid phototransistors with different silver halides, (AgCl, AgBr or AgI) under same visible illumination was examined. Since the AgCl is a wide band-gap ($E_g^{AgCl}$=3.25 eV) semiconductor, only ultraviolet sensitivity would be expected, assuming the same sensing mechanism as previously reported for graphene-semiconductor hybrid phototransistor. In contrast, a high photoresponse is observed with visible light illumination, suggesting a new sensing mechanism in our phototransistor. FIG. 7(b) shows the photocurrent (after dark current subtraction) of the as-prepared AgX-G photodetectors (e.g., phototransistors) at room temperature under chopped light illumination (white light illumination with power of ~54.9 nW) at 1 V source-drain voltage ($V_{SD}$) and 0V back-gate voltage ($V_G$). If working as traditional graphene hybrid phototransistor where the semiconductor is responsible for light absorption, the photoresponse of AgI-G hybrid should be highest as the AgI has the lowest bandgap and the highest photosensitivity. However, the observed photoresponse of AgCl-G hybrid is much stronger than that of AgBr-G and AgI-G, which strongly suggesting that the photoresponse is not originated from AgX nanoparticle absorption. This phenomenon can be attributed to the sub-bandgap photosensitivity, in an embodiment of the subject invention, to the electrochemical assisted internal photoemission from graphene to AgX nanoparticles. As illustrated in FIG. 7(c), upon illumination with low energy photon, the photoexcited hot carriers with energy higher than the Schottky barrier height ($\Phi_B$) can be injected into AgX nanoparticles and then stored into the low-energy redox level of AgX/Ag$^0$ via inducing the half electrochemical reduction reaction AgX+e$^-$→Ag$^0$+X$^-$, which will negatively charge the AgX nanoparticles and enhance the conductance of graphene transistor through capacitive coupling. In the dark, the reduction reaction is reversed and the injected electron is released back to graphene through tunneling process, restoring the phototransistor back to its low conductance state. Here, the sub-bandgap photoresponsivity of the graphene hybrid detector is primarily determined by the nanoparticle's ability of accepting electrons. In electrochemistry, the electrochemical potential (E) is classically used to represent the ability of accepting electrons for an oxidant. In our case, since the AgCl is a stronger oxidant than AgBr and AgI ($E_{AgCl/Ag}$=-4.66 eV<$E_{AgBr/Ag}$=-4.51 eV<$E_{AgI/Ag}$=-4.29 eV) and readily retains the injected hot carriers from the graphene, the highest gain and photoresponsivity in AgCl-G followed by AgBr-G and AgI-G is observed. This result suggested the classical standard electrochemical potential could also be used to benchmark the electron accepting ability of other electrochemical reaction assisted graphene hybrid phototransistors for low energy photon sensing. Without favorable redox couple (e.g. in ZnO-graphene hybrid), the internal photoemission from graphene to semiconductor is insignificant and the sub-bandgap photoresponse is negligible. Since the phototransistor according to an embodiment of the subject invention involves electrochemical redox reaction, it is important to assess the stability of our device, which is determined by the reversibility of the redox reaction. The AgCl-G sample was stored under ambient conditions for 6 months and then subjected to a long time test under chopped illumination, as seen in FIG. 7(d). After over 1000 on-off cycles, the photocurrent maintained the same level, indicating the great reversibility and reliability of our device.

Example 6

Figure 7E:
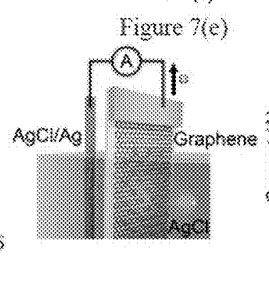
FIG. 7(e) shows a schematic diagram of the photo-electro-chemical measurement setup for internal photoemission at AgCl-graphene junction.
Figure 7F:
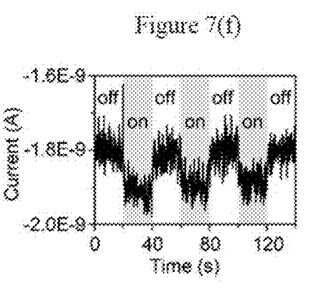
FIG. 7(f) shows a temporal photoelectrochemical response of AgCl-G working electrode at 0 V bias under chopped green light illumination (520 nm wavelength).

To confirm the sensing mechanism in the phototransistor, a photoelectrochemical electrode based on AgCl-G hybrid was fabricated to test the internal photoemission current from graphene to AgCl nanoparticles at 0 V bias. As shown in FIG. 7(e), AgCl nanoparticles loaded monolayer graphene was used as a working electrode and submerged into 1 M KCl solution with AgCl/Ag as the counter electrode. Upon illumination with low energy photons (520 nm), the AgCl cannot be excited while the hot electron is generated in graphene. The temporal photocurrent at 0 V bias in chopped green light illumination was recorded, as shown in FIG. 7(f). Since no detectable photocurrent is observed for AgCl nanoparticles over platinum surface which has similar work function as graphene ($\Phi_{graphene}$=4.9~5.1, $\Phi_{Pt}$=5.1), the photocurrent is clearly not originated from the AgCl absorption and should be attributed to the graphene internal photoemission, similar to the recently demonstrated graphene-semiconductor photodetector. In this mechanism, since the internal photoemission is controlled by the Schottky barrier height at the graphene-semiconductor interface instead of the bandgap of incorporated semiconductor, our photodetector is capable of exploiting sub-bandgap photons and extending the sensitivity to the visible spectrum. This strategy offers a new approach to engineer the spectral response of optoelectronic devices via surface engineering without using narrow bandgap materials.

Example 7

Figure 8A:
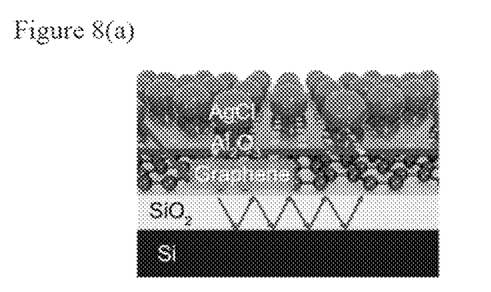
FIG. 8(a) shows an illustration of the multiple reflections within the dielectric layer beneath the monolayer graphene.
Figure 8B:
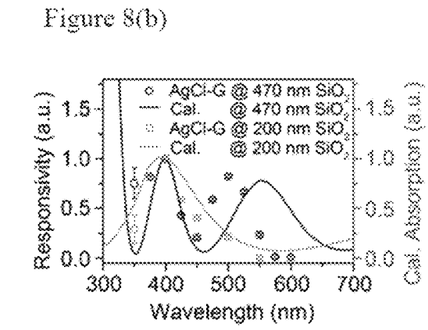
FIG. 8(b) shows an experimental wavelength-dependent responsivity of AgCl-G on thermal oxide substrates.
Figure 8C:
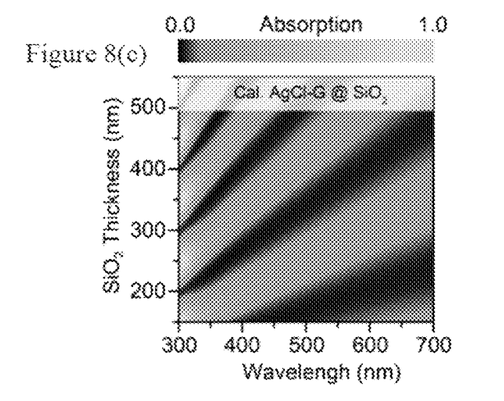
FIG. 8(c) shows an absorption intensity map for the AgCl-G as a function of both the excitation wavelength and the $SiO_2$ thickness.

To demonstrate that, in a phototransistor, the spectral selectivity can be accomplished by simply modulating the thickness of thermal oxide underneath graphene layer, as seen in FIG. 8(a). As shown in FIG. 8(b), for AgCl-G on a silicon substrate with 470 nm SiO$_2$, two major responsivity peaks, located at 400 nm and 500 nm are recorded. This enhancement can be attributed to the optical resonance inside the dielectric layer. The power absorption spectrum predicted by the finite-difference-time-domain (FDTD) simulation matches well with the experimental data. As a comparison, only a single photoresponse peak located around 400 nm can be identified for the photodetector fabricated on 200 nm SiO$_2$ substrate as calculated by the FDTD. An overview for spectral selectivity by changing the oxide thickness is shown in FIG. 8(c).

Figure 8D:
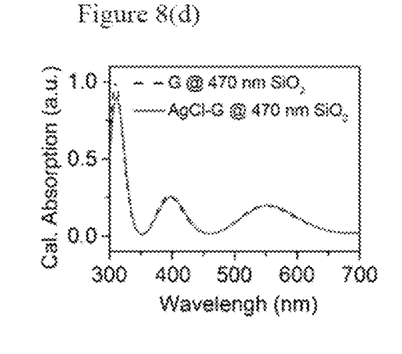
FIG. 8(d) shows a calculated absorption of AgCl-G and bare graphene on 470 nm $SiO_2$.

In contrary to a previously demonstrated graphene-semiconductor phototransistor, an embodiment of the subject invention relies on the photon absorption in graphene layer rather than in semiconductor. As shown in FIG. 8(d), the simulated absorption spectra of AgCl-G and bare graphene match well with each other in the visible region, indicating that the light absorption in AgCl is negligible for AgCl-G heterostructure. The power absorption ratio between graphene ($P_{graphene}$) and AgCl ($P_{AgCl}$) is 126:1 for 400 nm incident wavelength and even higher for 500 nm (246:1), which again confirms the distinct sensing mechanism of AgCl-G hybrid phototransistor.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

[1] Xia F N, Mueller T, Lin Y M, Valdes-Garcia A, Avouris P. Ultrafast graphene photodetector. Nat Nanotechnol 4, 839-843 (2009).
[2] Nair R R, et al. Fine structure constant defines visual transparency of graphene. Science 320, 1308-1308 (2008).
[3] Lemme M C, et al. Gate-Activated Photoresponse in a Graphene p-n Junction. Nano Lett 11, 4134-4137 (2011).
[4] Mueller T, Xia F N A, Avouris P. Graphene photodetectors for high-speed optical communications. Nat Photonics 4, 297-301 (2010).
[5] Gabor N M, et al. Hot Carrier-Assisted Intrinsic Photoresponse in Graphene. Science 334, 648-652 (2011).
[6] Sun D, et al. Ultrafast hot-carrier-dominated photocurrent in graphene. Nat Nanotechnol 7, 114-118 (2012).

[7] Tielrooij K J, et al. Generation of photovoltage in graphene on a femtosecond timescale through efficient carrier heating. Nat Nano 10, 437-443 (2015).

[8] Konstantatos G, at al. Hybrid graphene-quantum dot phototransistors with ultrahigh gain. Nat Nanotechnol 7, 363-368 (2012).

[9] Zhang D Y, Gan L, Cao Y, Wang Q, Qi L M, Guo X F. Understanding Charge Transfer at PbS-Decorated Graphene Surfaces toward a Tunable Photosensor.

[10] Kim C O, et al. High photoresponsivity in an all-graphene p-n vertical junction photodetector. Nat Commun 5, (2014).

[11] Konstantatos, Zhang and Klekachev A V, Cantoro M, van der Veen M H, Stesmans A L, Heyns M M, De Gendt S. Electron accumulation in graphene by interaction with optically excited quantum dots. Physica E: Low-dimensional Systems and Nanostructures 43, 1046-1049 (2011).

[12] Konstantatos, Shao D, et al. Organic-Inorganic Hetero-interfaces for Ultrasensitive Detection of Ultraviolet Light. Nano Lett 15, 3787-3792 (2015).

[13] Dang V Q, et al Ultrahigh Responsivity in Graphene-ZnO Nanorod Hybrid UV Photodetector. Small 11, 3054-3065 (2015).

[14] Lee Y, et al. High-Performance Perovskite-Graphene Hybrid Photodetector. Adv Mater 27, 41-46 (2015).

[15] Chen S-Y, et al., Biologically inspired graphene-chlorophyll phototransistors with high gain. Carbon 63, 23-29 (2013).

[16] Liu C H, Chang Y C, Norris T B, Zhong Z H. Graphene photodetectors with ultra-broadband and high responsivity at room temperature. Nat Nanotechnol 9, 273-278 (2014).

[17] Furchi M, et al. Microcavity-Integrated Graphene Photodetector. Nano Lett 12, 2773-2777 (2012).

[18] Gan X T, et al. Chip-integrated ultrafast graphene photodetector with high responsivity. Nat Photonics 7, 883-887 (2013).

[19] Echtermeyer T J, et al. Strong plasmonic enhancement of photovoltage in graphene. Nat Commun 2, (2011).

[20] Freitag M, Low T, Zhu W J, Yan H G, Xia F N, Avouris P. Photocurrent in graphene harnessed by tunable intrinsic plasmons. Nat Commun 4, (2013).

[21] Chen J N, et al. Optical nano-imaging of gate-tunable graphene plasmons. Nature 487, 77-81 (2012).

[22] Abergel D S L, Russell A, Fal'ko V I. Visibility of graphene flakes on a dielectric substrate. Applied Physics Letters 91, 063125 (2007).

[23] Roddaro S, Pingue P, Piazza V, Pellegrini V, Beltram F. The Optical Visibility of Graphene: Interference Colors of Ultrathin Graphite on SiO2. Nano Lett 7, 2707-2710 (2007).

[24] Lien D H, et al. Engineering Light Outcoupling in 2D Materials. Nano Lett 15, 1356-1361 (2015).

[25] Wang Y, et al. Hybrid Graphene-Perovskite Phototransistors with Ultrahigh Responsivity and Gain. Advanced Optical Materials 3, 1389-1396 (2015).

[26] Seiichi Sumi T W, Akira Fujishima, Kenichi Honda. Effect of Cl- and Br-Ions and pH on the Flatband Potentials of Silver Halide Sheet Crystal Electrodes. B Chem Soc Jpn 53, 2742-2747.

[27] Bose D N, Govindacharyulu P A. Physics of silver halides and their applications. Bull Mater Sci 2, 221-231 (1980).

[28] Bauer R S, Spicer W E, Silver-halide valence and conduction states: Temperature-dependent ultraviolet-photoemission studies. Phys Rev B 14, 4539-4550 (1976).

[29] Knight M W, Sobhani H, Nordlander P, Halas N J. Photodetection with Active Optical Antennas. Science 332, 702-704 (2011).

[30] Zheng B Y, Zhao H, Manjavacas A, McClain M, Nordlander P, Halas N J, Distinguishing between plasmon-induced and photoexcited carriers in a device geometry. Nat Commun 6, (2015).

[31] Breusing M, Ropers C, Elsaesser T. Ultrafast Carrier Dynamics in Graphite. Phys Rev Lett 102, 086809 (2009).

[32] Vany sek P. CRC Handbook of Chemistry and Physics, 96th ed. CRC Press (2015).

[33] Dong H, et al. Highly-effective photocatalytic properties and interfacial transfer efficiencies of charge carriers for the novel $Ag_2CO_3$/AgX heterojunctions achieved by surface modification, Dalton Trans 43, 7282-7289 (2014).

[34] Tani T., Explanation of Photocatalytic Water Splitting by Silver Chloride from Viewpoint of Solid State Physics and Photographic Sensitivity of Silver Halides, Journal of The Society of Photographic Science and Technology of Japan 72, 88-94 (2009).

What is claimed is:

1. A method of manufacturing a graphene semiconductor photodetector, the method comprising:
    providing a monolayer chemical vapor deposition ("CVD") of graphene on a metal;
    spin-coating a poly(methyl methacrylate) (PMMA) solution in anisole onto the graphene layer and air drying it;
    removing the metal on the reverse side of the graphene by etching;
    separating the released graphene on PMMA film and rinsing the film consecutively in a plurality of clean deionized ("DI") water baths;
    placing the film onto a clean substrate and air drying it;
    dissolving the PMMA with a solvent;
    patterning the graphene into a ribbon with e-beam lithography and oxygen;
    depositing silver (Ag) in a thermal evaporator on the e-beam lithography in a defined central area of the graphene ribbon;
    transforming the Ag into one of AgCl, AgBr, and AgI by a reaction with $Cl_2$, $Br_2$, or $I_2$, respectively;
    after the transformation of the Ag, coating $Al_2O_3$ by atomic layer deposition (ALD) onto the structure;
    removing the $Al_2O_3$ on the contact area by dipping it in a buffered HF solution (BHF), and patterning a nickel (Ni) electrode on the graphene ribbon with e-beam lithography followed by metal sputtering; and
    cleaning the PMMA.

2. The method of claim 1 wherein the step of spin-coating is carried out at 4,000 rpm for 1 minute with a 7 wt. % PMMA solution.

3. The method of claim 1 wherein the step of removing the metal on the reverse side of the graphene by etching is carried out with an oxygen reactive ion etching (RIE) for 2 minutes and then etching overnight in 0.1 M $(NH_4)_2S_2O_8$ aqueous solution.

4. The method of claim 1 wherein the substrate upon which the film is placed is one or more of a clean silicon substrate with 470 nm or 200 nm thermal oxide, quartz, or polyethylene terephthalate (PET) film.

5. The method of claim 1, wherein the Ag is deposited to a thickness of at least 0.5 nm.

6. The method of claim 1, wherein the step of dissolving PMMA is carried out with a mixture of dichloroethene and acetone.

7. The method of claim 1, wherein the step of transforming the Ag comprises transforming the Ag into AgCl by a reaction with $Cl_2$ via the following steps:
- covering a sample substrate with a layer of silica gel and placing it in a sealed vial with solid $KClO_3$;
- adding an HCl solution to the solid so the $Cl_2$ is generated in-situ ($KClO_3+6HCl=KCl+5Cl_2+3H_2O$); and
- allowing it to react with evaporated Ag nanoparticles.

8. The method of claim 1, wherein the step of transforming the Ag comprises transforming the Ag into AgBr by a reaction with $Br_2$ via the following steps:
- covering a sample substrate with a layer of silica gel and placing it in a sealed vial with solid KBr;
- adding solid $KMnO_4$ and $H_2SO_4$ mixture solution to the solid so a $Br_2$ vapor is produced by the reaction ($2KMnO_4+8H_2SO_4+10KBr=6K_2SO_4+5Br_2+2MnSO_4+8H_2O$); and
- allowing it to react with Ag nanoparticle.

9. The method of claim 1 wherein the step of transforming the Ag comprises transforming the Ag into AgI by a reaction with $I_2$ via the following steps:
- placing a sample substrate in a sealed vial containing $I_2$ solid; and
- heating the reaction vial to allow the $I_2$ vapor to react with Ag nanoparticle.

10. The method of claim 1, wherein the step of coating $Al_2O_3$ comprises utilizing trimethylaluminum as a precursor.

11. The method of claim 1, wherein the metal is copper, wherein the solvent is acetone, and wherein cleaning the PMMA comprises cleaning the PMMA with a mixture of dichloroethene and acetone.

* * * * *